United States Patent
Büthker

(10) Patent No.: US 10,871,526 B2
(45) Date of Patent: Dec. 22, 2020

(54) APPARATUS AND METHOD FOR DETECTING FAULTY CHARGE PUMP CAPACITOR

(71) Applicant: NXP B.V., Austin, TX (US)

(72) Inventor: Henricus Cornelis Johannes Büthker, Mierlo (NL)

(73) Assignee: NXP B.V., Eindhoven (NL)

(*) Notice: Subject to any disclaimer, the term of this patent is extended or adjusted under 35 U.S.C. 154(b) by 45 days.

(21) Appl. No.: 16/237,493

(22) Filed: Dec. 31, 2018

(65) Prior Publication Data
US 2020/0209298 A1 Jul. 2, 2020

(51) Int. Cl.
*G01R 31/64* (2020.01)
*F21S 41/141* (2018.01)
(Continued)

(52) U.S. Cl.
CPC .......... *G01R 31/64* (2020.01); *F21S 41/141* (2018.01); *G01R 19/16528* (2013.01);
(Continued)

(58) Field of Classification Search
CPC . G08B 13/2485; G11C 11/4074; G11C 5/147; G11C 11/406; G11C 16/30;
(Continued)

(56) References Cited

U.S. PATENT DOCUMENTS

| 6,549,064 B2 * | 4/2003 | Bandy | G06K 7/0008 |
| | | | 327/536 |
| 8,710,882 B2 * | 4/2014 | Zhang | H04L 7/0337 |
| | | | 327/156 |

(Continued)

FOREIGN PATENT DOCUMENTS

| JP | H0829465 A | 2/1996 |
| JP | 2002281735 A | 9/2002 |
| TW | 10403730 B | 8/2013 |

OTHER PUBLICATIONS

Liu et al., "A Machine Vision System for Film Capacitor Defect Inspection," 2015 IEEE 10th Conference on Industrial Electronics and Applications, 6 pages.

(Continued)

*Primary Examiner* — Vinh P Nguyen

(57) ABSTRACT

A light emitting diode (LED) lighting system for an automobile includes a switch block, a capacitor, a charge pump, and a capacitor detector. The charge pump includes an output to provide power to a gate driver of the switch block at a nominal voltage level. The capacitor detector circuit includes a detector input and a detector output. The detector input is connected to the charge pump output and to the charge pump capacitor to detect a voltage level on the charge pump capacitor. The capacitor detector circuit provides a first indication on the detector output that the charge pump capacitor is present and undamaged when the voltage level is greater than the nominal voltage level. The capacitor detector circuit further provides a second indication on the detector output that the charge pump capacitor is not present or is damaged when the voltage level is less than the nominal voltage level.

20 Claims, 5 Drawing Sheets

(51) Int. Cl.
  *H02M 3/07* (2006.01)
  *G01R 19/165* (2006.01)
  *H05B 45/37* (2020.01)
  *B60Q 1/04* (2006.01)

(52) U.S. Cl.
  CPC .............. *H02M 3/07* (2013.01); *H05B 45/37* (2020.01); *B60Q 1/04* (2013.01)

(58) Field of Classification Search
  CPC ... H02M 3/07; H02M 2001/0006; G05F 5/00; G05F 3/24; G01R 19/0023; G01R 19/25; G01R 31/64; G01R 19/16528; G06F 1/26; G06F 1/30; H02J 7/0019; H02J 7/345; H05B 45/37; F21S 41/141; B60Q 1/04
  See application file for complete search history.

(56) References Cited

U.S. PATENT DOCUMENTS

| | | | |
|---|---|---|---|
| 9,806,607 B2* | 10/2017 | Ranmuthu | H02M 1/32 |
| 10,090,758 B1* | 10/2018 | Li | H02M 3/07 |
| 10,389,236 B1* | 8/2019 | Low | H02M 3/07 |

OTHER PUBLICATIONS

Gaiero et al., "ICT Vs FCT Test : case studies," White Paper 14013, Dec. 6, 2014, version 2, 5 pages.

Sundaraj, K., "PCB Inspection for Missing or Misaligned Components using Background Subtraction," University Malaysia Perlis, School of Mechatronic Engineering, WSEAS Transactions on Information Science and Applications, Issue 5, vol. 6, May 2009, 10 pages.

* cited by examiner

US 10,871,526 B2

APPARATUS AND METHOD FOR DETECTING FAULTY CHARGE PUMP CAPACITOR

FIELD OF THE DISCLOSURE

This disclosure generally relates to electrical circuits for automotive use, and more particularly relates to detecting a faulty capacitor in a charge pump for LED lighting systems.

BACKGROUND

Electrical circuits for automotive use must be designed with a high level of functional safety. Depending on the criticality of a particular electrical circuit, the nature and extent of harm that can result from a failure of the electrical circuit, the likelihood of a failure of the electrical circuit, the likelihood that a driver of the vehicle can prevent injury in the event of a failure of the electrical circuit, and upon other factors, the electrical circuit will be subject of different functional safety standards. For example, where an automotive electrical circuit includes one or more integrated circuits (ICs) that utilize external components to provide various functions for the ICs, the International Standards Organization (ISO) standard, ISO 26262, Road Vehicles—Functional Safety, may require that the electrical circuit be designed to detect missing or failing external components.

Arrays of light emitting diodes (LEDs) are increasingly being used in automotive lighting applications to provide greater durability and flexibility over lighting solutions that utilize incandescent lighting. For example, incandescent lighting typically uses two lighting elements in each headlight, a low-beam element and a high-beam element. Here, when one of the elements fails, the lighting performance of the headlight is severely degraded. On the other hand, LED lighting typically uses around 20 to, in rare cases, hundreds of individual LEDs that are controlled to be turned on or off in, for example, two modes, a low-beam mode and a high-beam mode. In the high-beam mode, all of the LEDs of the LED array may be turned on, while in the low-beam mode, some portion of the LEDs may be turned off.

Here, when a particular LED fails, the lighting performance of the headlight is only degraded slightly, and it would take multiple LED failures to be able to detect the degraded performance. In another example, the two lighting elements of the incandescent solution noted above are typically configured to provide horizontal control, such that the low-beam element shines light lower to the ground, while the high-beam element shines higher than the low-beam element. LED lighting permits vertical control of the light beam from a headlight, in addition to horizontal control. Here, in a first mode the beam from a LED headlight may be controlled to shine through an angle in front of the LED headlight, and in a second mode the beam may be controlled to illuminate only a left hand portion of the angle by turning off a right hand portion of the LED array, or to illuminate only a right hand portion of the angle by turning off a left hand portion of the LED array.

In providing greater flexibility of lighting features, a LED lighting system may be configured to selectably turn on or off individual LEDs or groups of LEDs of the array. Where the LEDs are arranged in one or more groups of series connected LEDs, a turn-off voltage level for a particular LED that is connected closer to a source voltage may require a higher control voltage level to turn off the particular LED than may be required to turn off another LED that is connected closer to a ground voltage. One way to ensure that all switching elements remain functional is to drive control inputs to the LEDs by a higher voltage than the nominal voltage level of a particular power rail. This higher voltage level can be provided by a charge pump circuit that boosts a voltage level of a power rail to a higher voltage level for the control inputs. A charge pump typically utilizes one or more capacitors to provide the boosted voltage.

In a typical usage case, control of the LED array is provided by a LED lighting system IC that includes most of the circuit elements needed to control the LED array, except that the capacitor of the charge pump may be external to the IC. Hence, in order to meet various functional safety standards set out for automotive electrical circuits, a failure or a fault in the capacitor may need to be detected.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
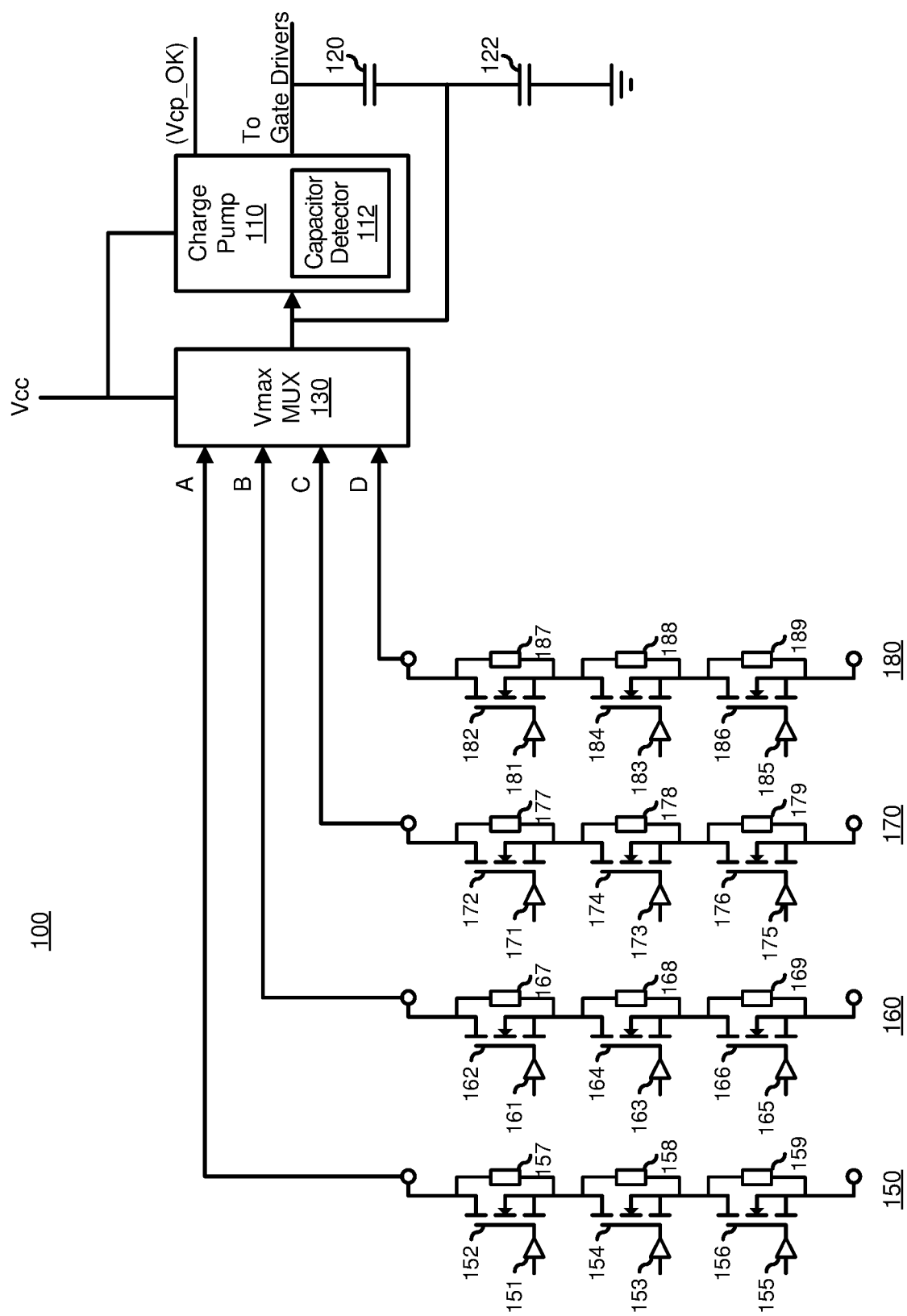
FIG. 1 is a block diagram of a light emitting diode (LED) lighting system according to an embodiment of the present disclosure.

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

A LED lighting system may include a charge pump, a charge pump capacitor, a filter capacitor, a multiplexor, and LED switch blocks. The charge pump may include a charge pump capacitor detector. The LED switch blocks may include a number of switches. The switches may each be associated with one or more LED elements that may be connected in parallel with the drain and source terminals of the respective switches, such that, when a particular switch is turned off, the associated LED elements are turned on and emit light, and when the particular switch is turned on, the associated LED elements are turned off and emit no light. Gate terminal of each of the switches may be connected to a LED controller that selectively turns on and off the associated LED elements to provide various high-beam/low-beam and beam shaping functions as needed or desired.

As the switches in the switch blocks are stacked, the absolute voltage level needed to turn on the switches that are higher in the stack, that is, that are connected closer to a power rail (Vcc), may increase. Where the gate terminals are sourced by only the power rail (Vcc), a voltage droop on the power rail (Vcc) could lead to the inability to turn off one or more of the LED elements associated with the switches that are higher in the stack, resulting in a potentially dangerous situation. Moreover, turning on multiple switches at the same time could induce a voltage droop if the power rail (Vcc) has an insufficient capacity or is otherwise not responsive to the current demands of the switching operations, resulting in some of the LED elements turning off more slowly than needed.

For this reason, a charge pump may be provided to increase an available voltage level to drive the gate terminals of the switches. Here, a charge pump capacitor may be charged to the voltage level of the power rail (Vcc) and the voltage across the charged charge pump capacitor may then be switched to be added to the voltage of the power rail (Vcc), and the summed voltage level may be provided to the gate switching voltage rails of the LED lighting system. The LED lighting system may be designed as one or more ICs that provide some of the functions, while one or more capacitor may be designed as separate components that are external to the ICs. Thus, in operation, the external components may become disconnected or damaged. Here, if the charge pump capacitor becomes damaged or is otherwise missing, then the ability of the charge pump to source current to turn on the switches may become greatly diminished. Thus, in order for the LED lighting system to meet functional safety requirements, it may be necessary to be able to detect when the charge pump capacitor is missing or damaged. As such, the charge pump may include a charge pump capacitor detector that may be configured to detect when charge the pump capacitor is missing or damaged.

FIG. 1 illustrates an embodiment of a LED lighting system 100, including a charge pump 110, a charge pump capacitor 120, a filter capacitor 122, a multiplexor 130, and LED switch blocks 150, 160, 170, and 180. Charge pump 110 includes a charge pump capacitor detector 112. LED switch block 150 includes switches 152, 154, and 156. LED switch block 160 includes switches 162, 164, and 166. LED switch block 170 includes switches 172, 174, and 176. LED switch block 180 includes switches 182, 184, and 186. Charge pump 110 includes a voltage input to receive power from a power rail (Vcc) at, for example, +5 Volts (V), a charge pump input and a charge pump output. Multiplexor 130 includes a voltage input to receive power form the power rail (Vcc), four mux inputs (A, B, C, D), and an output. The output of multiplexor 130 is connected to the charge pump input. A first terminal of charge pump capacitor 120 is connected to the charge pump output. A second terminal of charge pump capacitor 120 is connected to the output of multiplexor 130 and to the charge pump input. A first terminal of filter capacitor 122 is connected to the second terminal of charge pump capacitor 120, to the output of multiplexor 130, and to the charge pump input. A second terminal of filter capacitor 122 is connected to a ground plane.

LED switch block 150 is configured such that a drain terminal of switch 152 is connected to input A of multiplexor 130, a source terminal of switch 152 is connected to a drain terminal of switch 154, a source terminal of switch 154 is connected to a drain terminal of switch 156, and a source terminal of switch 156 is illustrated as being open. The open source terminal of switch 156 may typically be connected to the ground plane or to an additional switch block to make up an array of LED elements, as needed or desired. LED switch block 160 is configured such that a drain terminal of switch 162 is connected to input B of multiplexor 130, a source terminal of switch 162 is connected to a drain terminal of switch 164, a source terminal of switch 164 is connected to a drain terminal of switch 166, and a source terminal of switch 166 is illustrated as being open, and may be connected to the ground plane or to an additional switch block. LED switch block 170 is configured such that a drain terminal of switch 172 is connected to input C of multiplexor 130, a source terminal of switch 172 is connected to a drain terminal of switch 174, a source terminal of switch 174 is connected to a drain terminal of switch 176, and a source terminal of switch 176 is illustrated as being open, and may be connected to the ground plane or to an additional switch block. LED switch block 180 is configured such that a drain terminal of switch 182 is connected to input D of multiplexor 130, a source terminal of switch 182 is connected to a drain terminal of switch 184, a source terminal of switch 184 is connected to a drain terminal of switch 186, and a source terminal of switch 186 is illustrated as being open, and may be connected to the ground plane or to an additional switch block. The open source terminals of switches 156, 166, 176, and 186 are typically connected to the ground plane, or to additional switch blocks to make up an array of LED elements, as needed or desired. Switches 152, 154, 156, 162, 164, 166, 172, 174, 176, 182, 184, and 186 are each associated with one or more LED elements 157, 158, 159, 167, 168, 169, 177, 178, 179, 187, 188, 189 that are connected in parallel with the drain and source terminals of the respective switches, such that, when a particular switch is turned off, the associated LED elements are turned on and emit light, and when the particular switch is turned on, the associated LED elements are turned off and emit no light. The gate terminal of each of switches 152, 154, 156, 162, 164, 166, 172, 174, 176, 182, 184, and 186 are connected to a LED controller (not shown) that selectively turns on and off the associated LED elements to provide various high-beam/low-beam and beam shaping functions as needed or desired. Switches 152, 154, 156, 162, 164, 166, 172, 174, 176, 182, 184, and 186 are all illustrated as being N-channel enhancement type MOS FETs, but this is not necessarily so, and other types of switch elements may be utilized in a LED switch block, as needed or desired. The particulars of controlling the LED elements and high-beam/low-beam and beam shaping functions are known in the art and are beyond the scope of the present disclosure and will not be further discussed herein except as needed to describe the present embodiments.

As the switches in switch blocks 150, 160, 170, and 180 are stacked, the absolute voltage level needed to turn on the switches that are higher in the stack, that is, that are connected closer to the power rail (Vcc), increases. This is because the voltage at the source of any give switch is the sum of the voltage drops across each switch that is below the particular switch in the stack, and the gate-source voltage (Vgs) for the particular switch is lower the higher in the stack the particular switch is located. Where the gate terminals are sourced by only the power rail (Vcc), a voltage droop on the power rail (Vcc) could lead to the inability to turn off one or more of the LED elements associated with the switches that are higher in the stack, resulting in a potentially dangerous situation. For example, the failure to turn off one or more LED element that implements a high-beam/low-beam function may result in a headlight beam that blinds oncoming drivers, thereby increasing the likelihood of a collision. Moreover, turning on multiple switches at the same time could induce a voltage droop if the power rail (Vcc) has an insufficient capacity or is otherwise not responsive to the current demands of the switching operations, resulting in some of the LED elements turning off more slowly than needed.

For this reason, charge pump 110 is provided to increase an available voltage level to drive the gate terminals of switches 152, 154, 156, 162, 164, 166, 172, 174, 176, 182, 184, and 186. Here, charge pump capacitor 120 is charged to the voltage level of the power rail (Vcc) and the voltage across the charged charge pump capacitor is then switched to be added to the voltage of the power rail (Vcc), and the summed voltage level is provided to the gate switching voltage rails of LED lighting system 100. Thus charge pump capacitor 120 is sized to store sufficient charge to ensure that all gate voltages are high enough to ensure proper operation, and to provide sufficient current to ensure that LED elements are all turned off at the same time. In a particular case, charge pump capacitor 120 is sized differently depending on whether LED lighting system 100 is designed with one, two, three, or four or more switch blocks. For example, for one switch block, charge pump capacitor 120 can be a 4.7 nanoFarad (nF) capacitor, for two switch blocks, the charge pump capacitor can be a 10 nF capacitor, for three switch blocks, the charge pump capacitor can be a 15 nF capacitor, and for four switch blocks, the charge pump capacitor can be a 22 nF capacitor. LED lighting system 100 may further be configurable to drive one or more additional switch block, and charge pump capacitor 120 can be sized to a maximum of 68 nF. Filter capacitor 122 is provided to reduce noise in LED lighting system 100 and to provide enhanced electromagnetic compatibility (EMC), and can be, for example, a 220 picoFarad (pF) capacitor.

LED lighting system 100 may typically be designed as one or more ICs that provide the functions of charge pump 110, of multiplexor 130, and of the controller for switching the switches, and capacitors 120 and 122, and switch blocks 150, 160, 170, and 180 may typically be designed as separate components that are external to the ICs. Thus, in operation, the external components may become disconnected or damaged, for example as a result of an electrostatic discharge (ESD) event. Here, if charge pump capacitor 120 becomes damaged or is otherwise missing, then the ability of charge pump 110 to source current to turn on the switches becomes greatly diminished because the charge carrying capacity of the charge pump is reduced to only the charge that can be provided on the output of the charge pump based upon the parasitic capacitance of the output. For example, a typical parasitic capacitance on an open contact of an IC may be as low as 100 pF, which is likely to be insufficient to supply the transient loads of switching on switches 152, 154, 156, 162, 164, 166, 172, 174, 176, 182, 184, and 186. Thus, in order for LED lighting system 100 to meet functional safety requirements, it may be necessary to be able to detect when charge pump capacitor 120 is missing or damaged. Here, charge pump 110 includes the charge pump capacitor detector 112 that is configured to detect when charge pump capacitor 120 is missing or damaged, and to provide an indication (Vcp_OK) that the charge pump capacitor is ok, or is missing or damaged.

Figure 2:
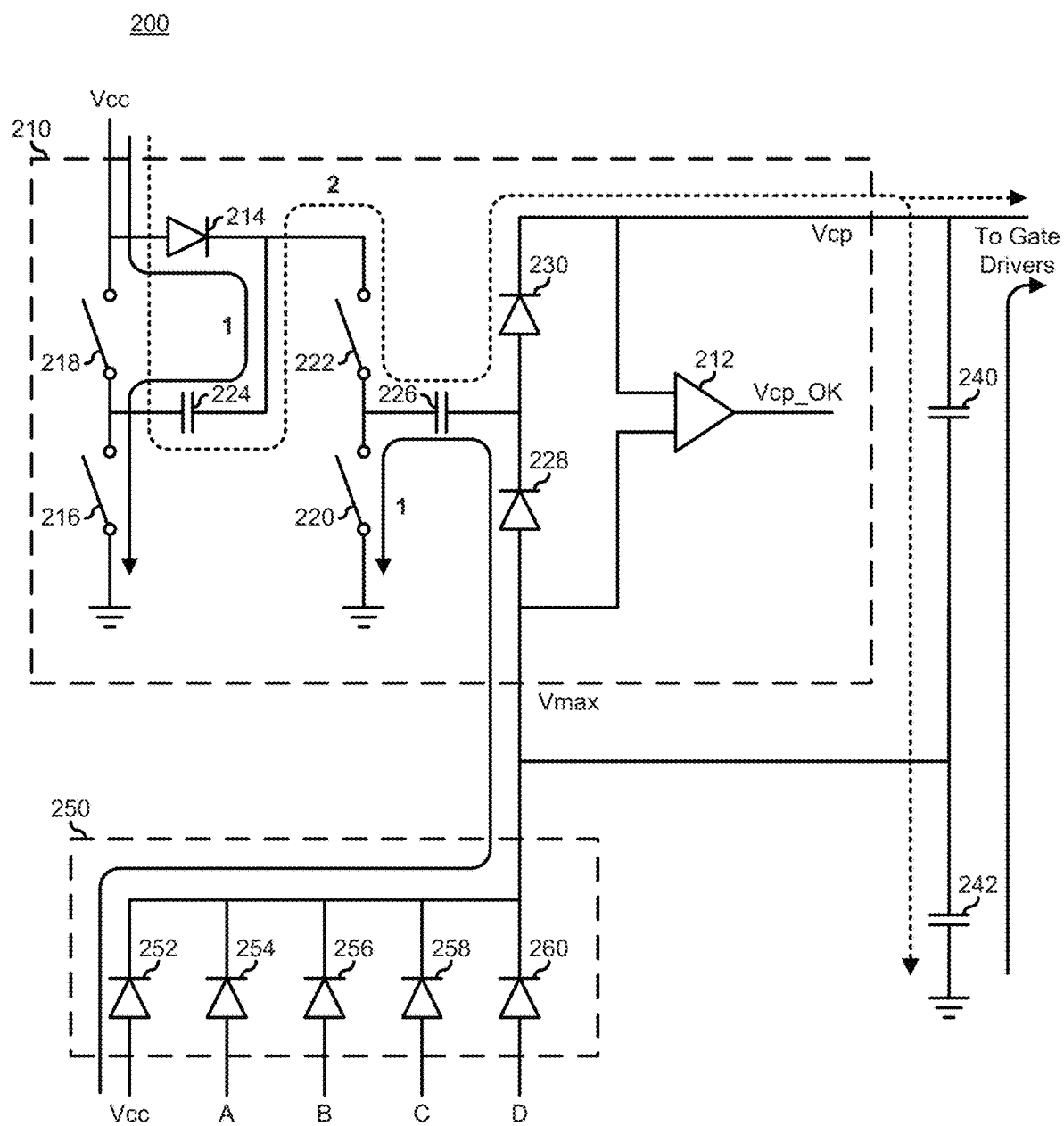
FIG. 2 is a block diagram of a charge pump circuit for a LED lighting system according to an embodiment of the present disclosure.

FIG. 2 illustrates a charge pump circuit 100 for a LED lighting system similar to LED lighting system 100. Charge pump circuit 200 includes a charge pump 210, a charge pump capacitor 240, a filter capacitor 242, and a multiplexor 250. Charge pump circuit 200 includes a charge pump capacitor detector 212, diodes 214, 228, and 230, switches 216, 218, 220, and 222, and capacitors 224 and 226. Multiplexor 250 includes diodes 252, 254, 256, 258, and 260. Charge pump 210 includes a voltage input to receive power from a power rail (Vcc) at, for example, +5 Volts (V), a charge pump input (Vmax) and a charge pump output (Vcp). Multiplexor 250 includes a voltage input to receive power form the power rail (Vcc), four mux inputs (A, B, C, D), and an output.

The power rail (Vcc) is connected to an anode terminal of diode 214 and to a first terminal of switch 218. A second terminal of switch 218 is connected to a first terminal of switch 216 and to a first terminal of capacitor 224. A second terminal of switch 216 is connected to a ground plane. A cathode contact of diode 214 is connected to a second terminal of capacitor 224 and to a first terminal of switch 222. A second terminal of switch 222 is connected to a first terminal of switch 220 and to a first terminal of capacitor 226. A second terminal of switch 220 is connected to a ground plane. A second terminal of capacitor 226 is connected to a cathode terminal of diode 228 and to an anode terminal of diode 230. A cathode contact of diode 230 is connected to a first input of charge pump capacitor detector 212 and, via the charge pump output (Vcp) to a first terminal of charge pump capacitor 240. An anode contact of diode 228 is connected to a second input of charge pump capacitor detector 212, and, via the charge pump input (Vmax) to a second contact of charge pump capacitor 240, to a first contact of filter capacitor 242, and to the output of multiplexor 250. A second terminal of filter capacitor 242 is connected to a ground plane. The output of multiplexor 250 is connected to the cathode terminals of diodes 252, 254, 256, 258, and 260. An anode terminal of diode 252 is connected to the power rail (Vcc). An anode terminal of diode 254 is connected to mux input A. An anode terminal of diode 256 is connected to mux input B. An anode terminal of diode 258 is connected to mux input C. An anode terminal of diode 260 is connected to mux input D.

In operation, charge pump 210 alternates between a pre-charge phase and a charge phase. In the pre-charge phase, indicated by the arrows labeled "1," switches 216 and 220 are closed and switches 218 and 222 are open. Here, capacitor 224 is pre-charged to near the voltage level of the power plane (Vcc) through diode 224, and capacitor 226 is pre-charged to near the voltage level of the power plane (Vcc) through diodes 252 and 228. In the charge phase, indicated by the dashed arrow labeled "2," switches 216 and 220 are open and switches 218 and 222 are closed. Here the charge on capacitors 224 and 226 is dumped onto charge pump capacitor 240

Charge pump circuit 200 operates to add Vcc, for example 5 V, to the maximum voltage available on the switch blocks, not shown, connected to the mux inputs A, B, C, and D, and in particular, to gate drivers 151, 153, 155, 161, 163, 165, 171, 173, 175, 181, 183, 185 (FIG. 1) of the individual switches. Here, when a switch is turned on, the associated gate driver demands current from the charge pump circuit 200, and in particular from charge pump capacitor 240, to charge the gate of the switch. The average current demand from charge pump circuit 200 is typically much lower than the required peak switching current demand. However, the peak switching current demand causes a voltage level on charge pump capacitor 240 to drop. If charge pump capacitor 240 is missing or damaged, there is little or no available charge, resulting in the voltage level dropping below a threshold that is detected by charge pump capacitor detector 212. When the voltage level across the charge pump input and the charge pump output, that is, across charge pump capacitor 240, drops below the threshold, charge pump capacitor detector 212 asserts an output signal (Vcp_OK) that can be used by a processing system or other circuitry to indicate the absence of insufficiency of the charge pump capacitor.

In a particular embodiment, a resister is added such that a first terminal of the resistor is connected to the cathode terminals of diodes 252, 254, 256, 258, and 260, and the second terminal of the resister is connected to the anode terminal of diode 228, the second terminal of charge pump capacitor 240, and the first terminal of filter capacitor 242. Such a resistor may be provided to limit peak current that may result from an ESD event, and may be, for example, a 400Ω resistor. In a particular embodiment, charge pump capacitor 240 is sized differently depending on whether the LED lighting system is designed with one, two, three, or four or more switch blocks. For example, for one switch block, charge pump capacitor 120 can be a 4.7 nF capacitor, for two switch blocks, the charge pump capacitor can be a 10 nF capacitor, for three switch blocks, the charge pump capacitor can be a 15 nF capacitor, and for four switch blocks, the charge pump capacitor can be a 22 nF capacitor. In a particular case, charge pump capacitor 240 can be sized to a maximum of 68 nF. Filter capacitor 242 is provided to reduce noise in the LED lighting system, and can be, for example, a 220 pF capacitor.

Figure 3:
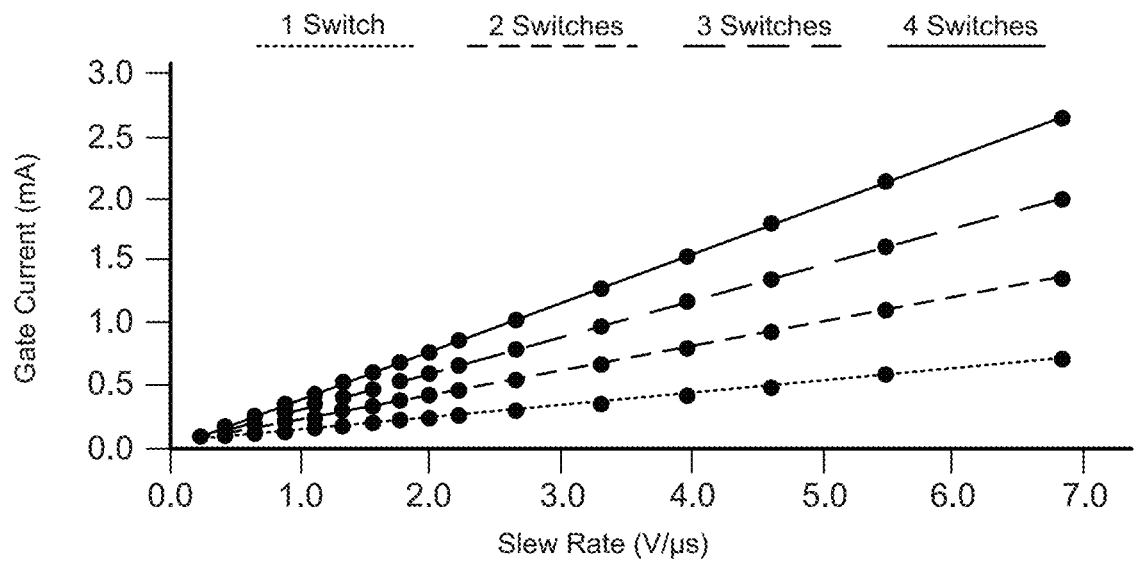
FIG. 3 is a graph illustrating the slew rate of the switches in a LED lighting system according to an embodiment of the present disclosure.

FIG. 3 illustrates the slew rate of the drain-source voltage of the switches in a LED lighting system similar to LED lighting system 100. Here, the slew rate for 1-2-, 3-, and 4-switches in parallel is show as being adjustable by choosing a lower gate turn-on current. A lower gate turn-on current will result in a lower and longer drop in the voltage level across the charge pump capacitor, such that, if the gate turn-on current is low enough, even a charge pump with a missing charge pump capacitor may prove sufficient to supply the maximum peak gate turn-on current demand. In such a case, the charge pump capacitor detector may not be triggered to indicate that the charge pump capacitor is missing or damaged. However, in such cases, the danger associated with a missing or damaged charge pump capacitor is absent because the charge pump provides sufficient current to satisfy the demand. On the other hand, designing the LED lighting system with such a low gate turn-on demand and the consequently lower slew rate may lead to visibly longer times for the desired beam pattern to stabilize after a change. In a particular embodiment, the slew rate is set to 2.6 V/μs or greater, in order to ensure proper detection of a missing or damaged charge pump capacitor.

Figure 4:
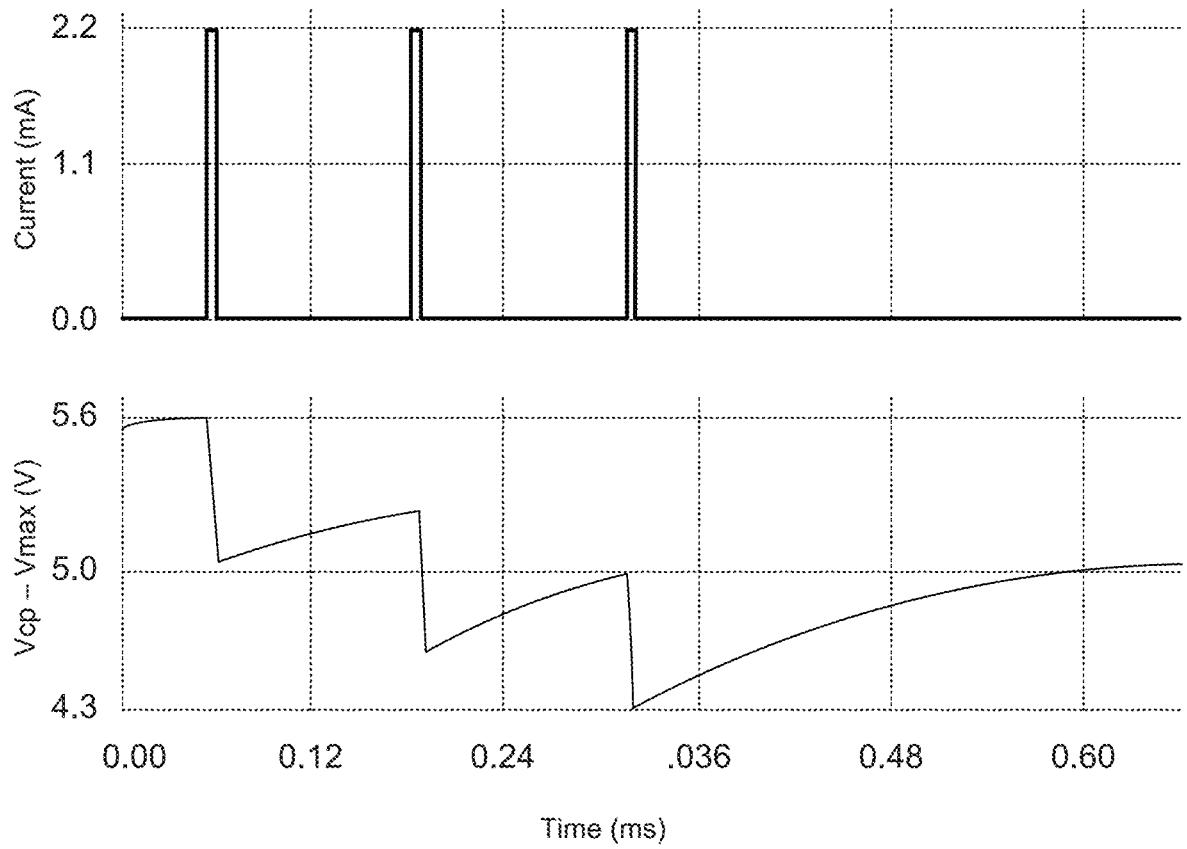
FIG. 4 is a graph illustrating gate turn-on events and an associated charge pump capacitor voltage in a LED lighting system according to an embodiment of the present disclosure.

FIG. 4 illustrates several gate turn-on events and the associated charge pump capacitor voltage. In a particular example, a gate charge needed to switch a switch on is about 3 nanocoulombs (nC). Thus, where the voltage level on the charge pump capacitor is controlled to 6 V and the charge pump capacitor is a 4.7 nF capacitor, drawing 3 nC results in a decrease in the voltage level on the charge pump capacitor that can be approximated as:

$$V = \frac{I \times T}{C} = \frac{Q}{C} = \frac{3}{4.7} = 0.64 \text{ V}. \qquad \text{Equation 1}$$

By similar approximation, the decrease in the voltage level on the charge pump capacitor for two or three switches can be determined to be about 0.6V, and for four switches can be determined to be about 0.55 V.

In a particular embodiment, the voltage level across a charge pump capacitor can be maintained at between 5.6 V and 5.9 V. In corner conditions the voltage level across the charge pump capacitor may be expected to drop to 5 V, which may still be within a particular design specification. Here, a further drop of 0.6 V, that is, from the turning on of one more switch, may be expected to result in a minimum voltage level across the charge pump capacitor of 4.4 V. In a particular embodiment, a detection threshold for a charge pump capacitor detector may be set to 3.6 V, being sufficiently below the lowest "good" value of 4.4 V, but giving enough margin to detect true damage to, or a missing charge pump capacitor. In a particular embodiment, a charge pump capacitor detector is configured with some level of hysteresis. For example, the charge pump capacitor detector output (Vcp_OK) may be configured to switch to a high state when the voltage level across the charge pump capacitor passes above 4.3 V, and may be configured to switch to a low state when the voltage level passes below 3.6 V. Thus, when the charge pump capacitor detector is in the low state, for example after several gate turn-on events, or at startup, the voltage level across the charge pump capacitor would need to reach at least 4.6 V before the output of the charge pump capacitor detector output switches back to the high state. However, when the charge pump capacitor is missing altogether, the minimal parasitic capacitance of the open circuit, typically around 100 pF, would result in a single gate turn-on event causing a voltage drop of at around 3 nC/100 pF=30 V, completely discharging the parasitic capacitance to zero and resulting in the charge pump capacitor detector output (Vcp_OK) going to the low state.

In a particular embodiment, the charge pump capacitor detector is configured to provide a blanking time, that is, a delay between the time at which the voltage across the charge pump capacitor drops below the detection limit of the charge pump capacitor detector, and the time when the charge pump capacitor detector output switches to the low state. This blanking time can be provided in order to de-glitch the output signal or to account for noise in the charge pump output. The duration of the blanking time will typically be shorter than the shortest gate turn-on pulse. Otherwise the dip due to gate current would not be noticed. For example, when the charge pump capacitor is missing or damaged, the duration of a drop in the voltage level across the charge pump capacitor can be determined by the output current capability of the charge pump and the required gate turn-on charge. If a charge pump can deliver 150 μA, then the required time to fully charge the gate is can be given as:

$$T = \frac{Q}{I} = 20 \text{ μs}. \qquad \text{Equation 2}$$

Figure 5:
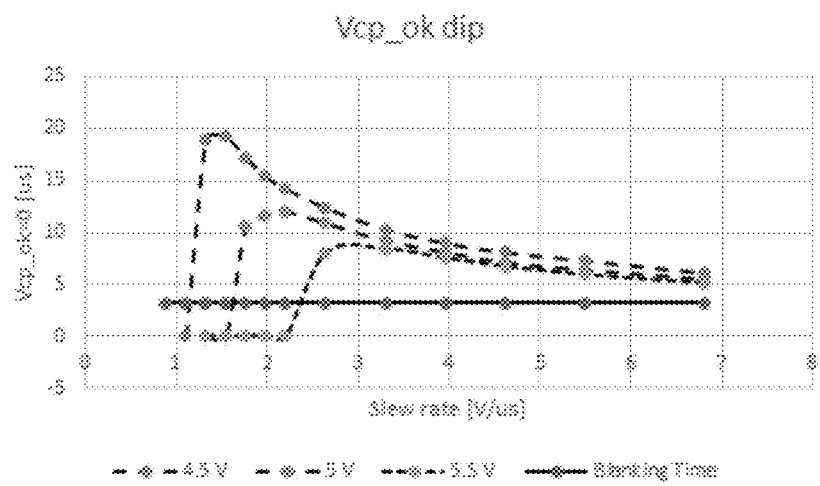
FIG. 5 is a graph illustrating a time to assert a charge pump detector output (Vcp_OK) versus a designed slew rate for a LED lighting system according to an embodiment of the present disclosure.

FIG. 5 illustrates a time to assert the charge pump detector output (Vcp_OK) versus the designed slew rate for the LED lighting system. It can be seen from the graph, that the duration of the dip can depend on the available supply voltage. The minimum duration is about 5 μs in this example. The blanking time is illustrated at 3, but may typically be selected as 5 μs or less. Here, a drop in the voltage level across the charge pump capacitor to lower than the detection threshold for less than 3 μs will not result in the charge pump capacitor detector output (Vcp_OK) switching to the low state, thereby ensuring that the charge pump capacitor is indeed damaged or missing when the output does switch to the low state.

Figure 6:
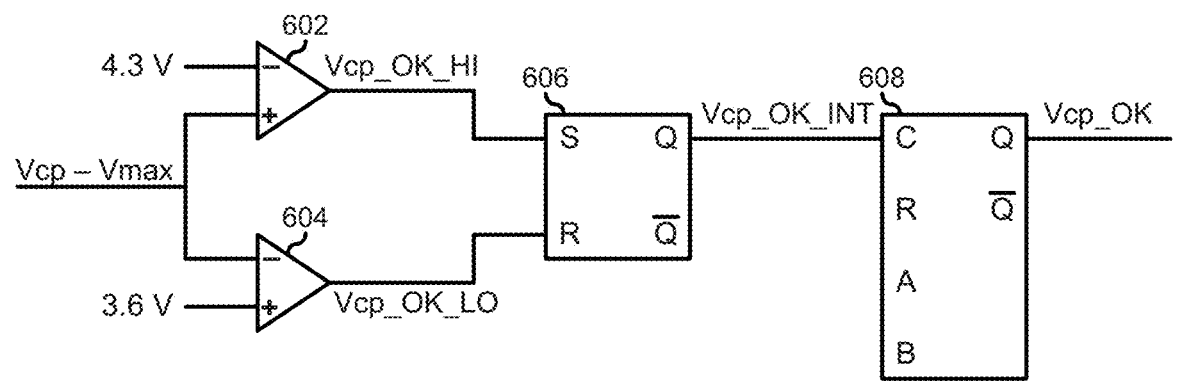
FIG. 6 is a block diagram of a charge pump detector circuit 600 that provides for a hysteresis function and a blanking time before providing a charge pump capacitor detector output according to an embodiment of the present disclosure.

FIG. 6 illustrates a charge pump detector circuit 600 that provides for a hysteresis function and a blanking time before providing a charge pump capacitor detector output. Charge pump capacitor detector circuit 600 includes comparators 602 and 606, and logic blocks 606 and 608. Comparator 602 includes an inverting input to receive a high voltage threshold reference voltage (4.3 V), a non-inverting input to receive a voltage level indication (Vcp−Vmax) from a charge pump capacitor, and an output to provide a charge pump capacitor high voltage OK (Vcp_OK_HI) indication. Comparator 604 includes a non-inverting input to receive a low voltage threshold reference voltage (3.6 V), an inverting input to receive the voltage level indication (Vcp−Vmax), and an output to provide a charge pump capacitor low voltage OK (Vcp_OK_LO) indication. Logic element 606 is a SR-flip-flop that receives the charge pump capacitor high voltage OK (Vcp_OK_HI) indication on an S-input, that receives the charge pump capacitor low voltage OK (Vcp_OK_LO) indication on an R-input, and that provides a charge pump capacitor OK intermediate (Vcp_OK_INT) indication on a Q-output. Logic element 608 is a one-shot timer that receives the charge pump capacitor OK intermediate (Vcp_OK_INT) indication and that, after a preset delay time, provides the charge pump capacitor detector output (Vcp_OK) on a Q-output. Here, charge pump detector circuit 600 provides a hysteresis of between 3.6 V and 4.3 V, as described above, and that provides a programmable blanking time as described above.

Figure 7:
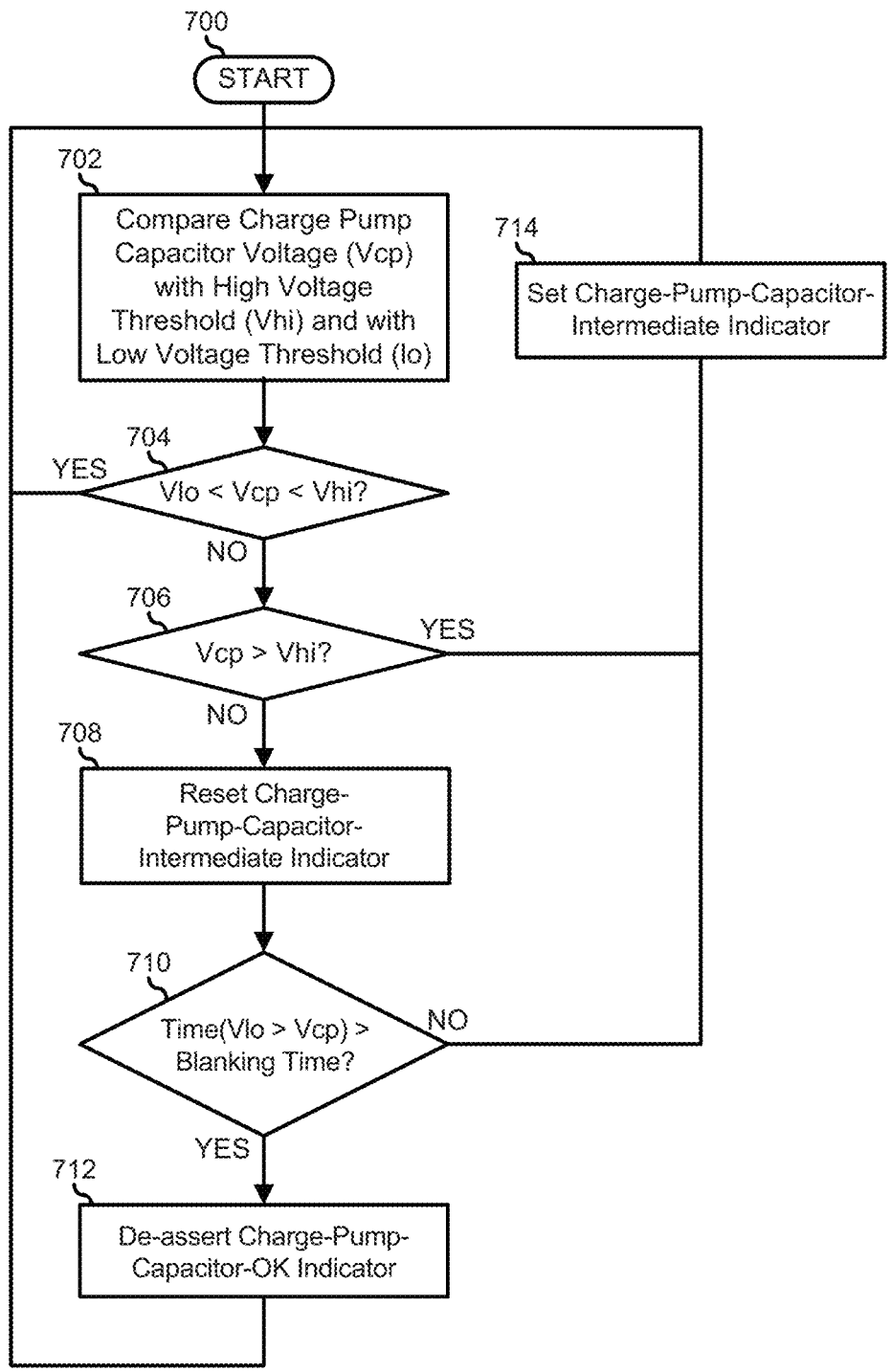
FIG. 7 is a flowchart illustrating a method for detecting a faulty capacitor in a charge pump for a LED lighting controller according to an embodiment of the present disclosure.

FIG. 7 illustrates a method for detecting a faulty capacitor in a charge pump for a LED lighting system, starting at block 700. At block 702, a voltage across a charge pump capacitor is compared with a high voltage threshold and with a low voltage threshold. For example, a voltage level across a charge pump capacitor can be provided to a non-inverting input of a first comparator where the inverting input is provided by a 4.3 V reference voltage, and the voltage level across the charge pump capacitor can further be provided to an inverting input of a second comparator where the non-inverting input is provided by a 3.6 V reference voltage. Here, the first comparator can provide a comparison of the voltage across the charge pump capacitor with the high voltage threshold, and the second comparator can provide a comparison of the voltage across the charge pump capacitor with the low voltage threshold. An output of the first comparator can be described as a Charge-Pump-Capacitor-OK-High signal, and an output of the second comparator can be described as a Charge-Pump-Capacitor-OK-Low signal.

In decision block 704, a decision is made as to whether or not the voltage across the charge pump capacitor is greater than the low voltage threshold and is also less than the high voltage threshold. If the voltage across the charge pump capacitor is greater than the low voltage threshold and is also less than the high voltage threshold, the "YES" branch of decision block 704 is taken and the method returns to block 702 where the voltage across a charge pump capacitor is compared with the high and low voltage thresholds. If the voltage across the charge pump capacitor is either greater than the low voltage threshold or less than the high voltage threshold, the "NO" branch of decision block 704 is taken and the method proceeds to decision block 706.

In decision block 706, a decision is made as to whether or not the voltage across the charge pump capacitor is greater than the high voltage threshold. If so, the "YES" branch of decision block 706 is taken, a Charge-Pump-Capacitor-Intermediate indicator is set in block 714, and the method returns to block 702 where the voltage across a charge pump capacitor is compared with the high and low voltage thresholds. If the voltage across the charge pump capacitor is not greater than the high voltage threshold, the "NO" branch of decision block 706 is taken, the Charge-Pump-Capacitor-Intermediate indicator is reset in block 708, and the method proceeds to decision block 710. Here, for example, the output of the first comparator, the Charge-Pump-Capacitor-OK-High signal, can be provided to a S-input of a SR-flip-flop, and the Charge-Pump-Capacitor-OK-Low signal can be provided to a R-input of the SR-flip-flop. In this way, a hysteresis is established for the voltage level across the charge pump capacitor. An output of the SR-flip-flop can be described as the Charge-Pump-Capacitor-Intermediate indicator.

In decision block 710, a decision is made as to whether or not the Charge-Pump-Capacitor-Intermediate indicator is reset for longer than a blanking time. As indicated in decision block, the condition is depicted as "Time(Vlo>Vcp) >Blanking Time?" If the Charge-Pump-Capacitor-Intermediate indicator is not reset for longer than the blanking time, then the "NO" branch of decision block 710 is taken, the Charge-Pump-Capacitor-Intermediate indicator is set in block 714, and the method returns to block 702 where the voltage across a charge pump capacitor is compared with the high and low voltage thresholds. If the Charge-Pump-Capacitor-Intermediate indicator is reset for longer than the blanking time, the "YES" branch of decision block 710 is taken, then a Charge-Pump-Capacitor-OK indicator is de-asserted in block 712, and the method returns to block 702 where the voltage across a charge pump capacitor is compared with the high and low voltage thresholds. For example, the Charge-Pump-Capacitor-Intermediate indicator can be provided to an input of a programmable one-shot timer that only desserts a Charge-Pump-Capacitor-OK indicator if the Charge-Pump-Capacitor-Intermediate indicator is reset for longer than a pre-set blanking time.

In the above embodiments, various indications are provided that give a status of a charge pump capacitor for a LED lighting system as being either OK on the one hand, or missing or damaged on the other hand. Here, it will be understood that, because the presence or absence of a charge pump capacitor for a LED lighting system in an automobile may be considered to be a safety critical fact, an indication of such is to be processed by a vehicle processing system to provide an alert to a driver, to initiate mitigating or back-up procedures, to provide a warning to an external vehicle management system, or the like, as needed or desired. The methods and procedures for processing of such an indication is known in the art and will not be further discussed herein, except as needed to illuminate the present disclosure. However, it will be further understood that the ability to detect the presence or absence of a charge pump capacitor for a LED lighting system, or the degradation thereof, is an improvement over LED lighting systems in an automobile that are not similarly equipped.

In some embodiments, a light emitting diode (LED) lighting system for an automobile, the LED lighting system can comprise a switch block including a switch element with a drain terminal coupled to a power rail, a source terminal, and a gate terminal coupled to a gate driver; a LED element connected in parallel with the drain and source terminals of the switch element such that the LED element emits light when the gate driver switches the switch element off and such that the LED element does not emit light when the gate driver switches the switch element on, wherein the power rail provides power to the switch block at a first voltage level; a charge pump capacitor; a charge pump coupled to the power rail, the charge pump including a charge pump output connected to a first terminal of the charge pump capacitor, the charge pump output to provide power to the gate driver at a nominal voltage level, the nominal voltage level being greater than the first voltage level, the charge pump further including a charge pump input coupled to the drain terminal and to a second terminal of the charge pump capacitor; and a capacitor detector circuit including a detector input and a detector output, the detector input connected to the charge pump output and to the first terminal of the charge pump capacitor to detect a second voltage level on the charge pump capacitor, the capacitor detector circuit to provide a first indication on the detector output that the charge pump capacitor is present and undamaged when the second voltage level is greater than the nominal voltage level and to provide a second indication on the detector output that the charge pump capacitor is not present or is damaged when the second voltage level is less than the nominal voltage level.

In another aspect, the capacitor detector circuit can further provide the first indication on the detector output not only when the second voltage level is greater than the nominal voltage level, but also when the second voltage level is greater than a high voltage threshold reference voltage .

In another aspect, the capacitor detector circuit can further provide the second indication on the detector output not only when the second voltage level is less than the nominal voltage level, but also when the second voltage level is less than a low voltage threshold reference voltage.

In another aspect, the capacitor detector circuit can be further to provide the second indication on the detector output not only when the second voltage level is less than the nominal voltage level and when the second voltage level is less than a low voltage level threshold, but also when the second voltage level is less than the low voltage level threshold for longer than a predetermined amount of time, the predetermined amount of time being a non-zero amount of time.

In another aspect, the predetermined amount of time can be less than a gate turn-on time of the gate driver.

In another aspect, the LED lighting system can further comprise a filter capacitor including a first terminal connected to the second terminal of the charge pump capacitor and a second terminal connected to a ground plane.

In another aspect, in detecting the second voltage level on the charge pump capacitor, the capacitor detector circuit can detect a voltage only across the first and second terminals of the charge pump capacitor.

In another aspect, in detecting the second voltage level on the charge pump capacitor, the capacitor detector circuit can detect a voltage between the first terminal of the charge pump capacitor and the ground plane.

In another aspect, a slew rate of the gate driver can be configurable, and wherein a capacity of the charge pump capacitor can be sized based upon the slew rate.

In other embodiments, a method of detecting the presence of a charge pump capacitor in a light emitting diode (LED) lighting system for an automobile can comprise providing, on a switch block of the LED lighting system, a switch element, the switch element including a drain terminal coupled to a power rail, a source terminal, and a gate terminal coupled to a gate driver; a LED element connected in parallel with the drain and source terminals of the switch element such that the LED element emits light when the gate driver switches the switch element off and such that the LED element does not emit light when the gate driver switches the switch element on, wherein the power rail provides power to the switch block at a first voltage level; coupling a charge pump output of a charge pump of the LED lighting system to a first terminal of a charge pump capacitor, the charge pump output to provide power to the gate driver at a nominal voltage level on the charge pump output, the nominal voltage level being greater than the first voltage level; coupling a charge pump input of the charge pump to the drain terminal and to a second terminal of the charge pump capacitor; and coupling a detector input of a capacitor detector circuit of the LED lighting system to the charge pump output and to the first terminal of the charge pump capacitor to detect a second voltage level on the charge pump capacitor providing, on a detector output of the capacitor detector circuit, a first indication on the detector output that the charge pump capacitor is present and undamaged when the second voltage level is greater than the nominal voltage level; and providing, on the detector output, a second indication on the detector output that the charge pump capacitor is not present or is damaged when the second voltage level is less than the nominal voltage level.

In another aspect, the method can further comprise providing, by the capacitor detector circuit, the first indication on the detector output not only when the second voltage level is greater than the nominal voltage level, but also when the second voltage level is greater than a high voltage threshold reference voltage.

In another aspect, the method can further comprise providing, by the capacitor detector circuit, the second indication on the detector output not only when the second voltage level is less than the nominal voltage level, but also when the second voltage level is less than a low voltage threshold reference voltage.

In another aspect, the method can further comprise providing, by the capacitor detector circuit, the second indication on the detector output not only when the second voltage level is less than the nominal voltage level and when the second voltage level is less than a low voltage level threshold, but also when the second voltage level is less than the low voltage level threshold for longer than a predetermined amount of time, the predetermined amount of time being a non-zero amount of time.

In another aspect, the predetermined amount of time can be less than a gate turn-on time of the gate driver.

In another aspect, the method can further comprise connecting a first terminal of a filter capacitor of the LED lighting system to the second terminal of the charge pump capacitor; and coupling a second terminal of the filter capacitor to a ground plane.

In another aspect, in detecting the second voltage level on the charge pump capacitor, the capacitor detector circuit can detect a voltage only across the first and second terminals of the charge pump capacitor.

In another aspect, in detecting the second voltage level on the charge pump capacitor, the capacitor detector circuit can detect a voltage between the first terminal of the charge pump capacitor and the ground plane.

In another aspect, a slew rate of the gate driver can be configurable, and wherein a capacity of the charge pump capacitor is sized based upon the slew rate.

In further embodiments, a charge pump system for a light emitting diode (LED) lighting system for an automobile, the charge pump system can comprise a charge pump capacitor; a charge pump coupled to a power rail, the charge pump including a charge pump output connected to a first terminal of the charge pump capacitor, the charge pump output to provide power to a gate driver of a LED element switch block at a nominal voltage level on the charge pump output, the nominal voltage level being greater than a first voltage threshold reference voltage, the charge pump further including a charge pump input coupled to the first terminal and to a second terminal of the charge pump capacitor; and a capacitor detector circuit including a detector input and a detector output, the detector input connected to the charge pump output and to the first terminal of the charge pump capacitor to detect a second voltage level on the charge pump capacitor, the capacitor detector circuit to provide a first indication on the detector output that the charge pump capacitor is present and undamaged when the second voltage level is greater than the nominal voltage level and to provide a second indication on the detector output that the charge pump capacitor is not present or is damaged when the second voltage level is less than the nominal voltage level.

In another aspect, the capacitor detector circuit can be further to provide the first indication on the detector output not only when the second voltage level is greater than the nominal voltage level, but also when the second voltage level is greater than a high voltage threshold reference voltage, and wherein the capacitor detector circuit is further to provide the second indication on the detector output not only when the second voltage level is less than the nominal voltage level, but also when the second voltage level is less than a low voltage threshold reference voltage.

The preceding Specification in combination with the Figures and the Claims, hereinafter "the present disclosure," is provided to assist in understanding the teachings disclosed herein. The descriptions included in the present disclosure focused on specific implementations and embodiments of the teachings of the present disclosure. This focus was provided to assist in describing the teachings and should not be interpreted as a limitation on the scope or applicability of the teachings or of other embodiments that utilize the teachings. However, other teachings can be used in combination with the teachings of the present disclosure, and the teachings of the present disclosure can also be used in other contexts and embodiments, and with different types of architectures. Other embodiments, uses, and advantages of the teachings of the present disclosure will be apparent to those skilled in the art based on the Specification and Figures. The present disclosure should therefore be considered exemplary only, and the scope of the present disclosure is accordingly intended to be limited only by the following claims and equivalents thereof.

As used herein, relational terms such as "first" and "second," and the like, may be used solely to distinguish one entity or action from another entity or action without necessarily requiring or implying any actual such relationship or order between such entities or actions. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element. As used herein, the terms "substantially," "about," and their variants, as used herein are intended to refer to the qualified article being sufficient to achieve the stated purpose or value in a practical manner, which includes taking into account any minor imperfections or deviations, if any, that arise from usual and expected abnormalities that may occur during device operation, which are not significant for the stated purpose or value. In addition, the term "substantially" may have been further defined herein in the context of specific attributes to identify specific ranges.

Note that not all of the activities or elements described in the present disclosure may be required, that one or more portion of a specific activity or device described herein may not be required, and that one or more further activities may be performed, or elements included, in addition to those described herein. Still further, the order in which activities are listed is not necessarily the order in which they are performed.

In addition, the concepts of the present disclosure have been described with reference to specific embodiments. However, one of ordinary skill in the art may appreciate that various modifications and changes can be made to the teachings of the present disclosure without departing from the scope of the present disclosure. Accordingly, the present disclosure is to be regarded in an illustrative rather than a restrictive sense, and all such modifications are intended to be included within the scope of the present disclosure.

Benefits, advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A light emitting diode (LED) lighting system for an automobile, the LED lighting system comprising:
  a switch block including a switch element with a drain terminal coupled to a power rail, a source terminal, and a gate terminal coupled to a gate driver;
  a LED element connected in parallel with the drain and source terminals of the switch element such that the LED element emits light when the gate driver switches the switch element off and such that the LED element does not emit light when the gate driver switches the switch element on, wherein the power rail provides power to the switch block at a first voltage level;
  a charge pump capacitor;
  a charge pump coupled to the power rail, the charge pump including a charge pump output connected to a first terminal of the charge pump capacitor, the charge pump output to provide power to the gate driver at a nominal voltage level, the nominal voltage level being greater than the first voltage level, the charge pump further including a charge pump input coupled to the drain terminal and to a second terminal of the charge pump capacitor; and
  a capacitor detector circuit including a detector input and a detector output, the detector input connected to the charge pump output and to the first terminal of the charge pump capacitor to detect a second voltage level on the charge pump capacitor, the capacitor detector circuit to provide a first indication on the detector output that the charge pump capacitor is present and undamaged when the second voltage level is greater than the nominal voltage level and to provide a second indication on the detector output that the charge pump capacitor is not present or is damaged when the second voltage level is less than the nominal voltage level.

2. The LED lighting system of claim 1, wherein the capacitor detector circuit is further to provide the first indication on the detector output not only when the second voltage level is greater than the nominal voltage level, but also when the second voltage level is greater than a high voltage threshold reference voltage.

3. The LED lighting system of claim 2, wherein the capacitor detector circuit is further to provide the second indication on the detector output not only when the second voltage level is less than the nominal voltage level, but also when the second voltage level is less than a low voltage threshold reference voltage.

4. The LED lighting system of claim 3, wherein the capacitor detector circuit is further to provide the second indication on the detector output not only when the second voltage level is less than the nominal voltage level and when the second voltage level is less than a low voltage level threshold, but also when the second voltage level is less than the low voltage level threshold for longer than a predetermined amount of time, the predetermined amount of time being a non-zero amount of time.

5. The LED lighting system of claim 4, wherein the predetermined amount of time is less than a gate turn-on time of the gate driver.

6. The LED lighting system of claim 1, further comprising:
a filter capacitor including a first terminal connected to the second terminal of the charge pump capacitor and a second terminal connected to a ground plane.

7. The LED lighting system of claim 6, wherein in detecting the second voltage level on the charge pump capacitor, the capacitor detector circuit detects a voltage only across the first and second terminals of the charge pump capacitor.

8. The LED lighting system of claim 6, wherein in detecting the second voltage level on the charge pump capacitor, the capacitor detector circuit detects a voltage between the first terminal of the charge pump capacitor and the ground plane.

9. The LED lighting system of claim 1, wherein a slew rate of the gate driver is configurable, and wherein a capacity of the charge pump capacitor is sized based upon the slew rate.

10. A method of detecting the presence of a charge pump capacitor in a light emitting diode (LED) lighting system for an automobile, the method comprising:
providing, on a switch block of the LED lighting system, a switch element, the switch element including a drain terminal coupled to a power rail, a source terminal, and a gate terminal coupled to a gate driver;
a LED element connected in parallel with the drain and source terminals of the switch element such that the LED element emits light when the gate driver switches the switch element off and such that the LED element does not emit light when the gate driver switches the switch element on, wherein the power rail provides power to the switch block at a first voltage level;
coupling a charge pump output of a charge pump of the LED lighting system to a first terminal of a charge pump capacitor, the charge pump output to provide power to the gate driver at a nominal voltage level on the charge pump output, the nominal voltage level being greater than the first voltage level;
coupling a charge pump input of the charge pump to the drain terminal and to a second terminal of the charge pump capacitor; and
coupling a detector input of a capacitor detector circuit of the LED lighting system to the charge pump output and to the first terminal of the charge pump capacitor to detect a second voltage level on the charge pump capacitor
providing, on a detector output of the capacitor detector circuit, a first indication on the detector output that the charge pump capacitor is present and undamaged when the second voltage level is greater than the nominal voltage level; and
providing, on the detector output, a second indication on the detector output that the charge pump capacitor is not present or is damaged when the second voltage level is less than the nominal voltage level.

11. The method of claim 10, further comprising:
providing, by the capacitor detector circuit, the first indication on the detector output not only when the second voltage level is greater than the nominal voltage level, but also when the second voltage level is greater than a high voltage threshold reference voltage.

12. The method of claim 11, further comprising:
providing, by the capacitor detector circuit, the second indication on the detector output not only when the second voltage level is less than the nominal voltage level, but also when the second voltage level is less than a low voltage threshold reference voltage.

13. The method of claim 12, further comprising:
providing, by the capacitor detector circuit, the second indication on the detector output not only when the second voltage level is less than the nominal voltage level and when the second voltage level is less than a low voltage level threshold, but also when the second voltage level is less than the low voltage level threshold for longer than a predetermined amount of time, the predetermined amount of time being a non-zero amount of time.

14. The method of claim 13, wherein the predetermined amount of time is less than a gate turn-on time of the gate driver.

15. The method of claim 10, further comprising:
connecting a first terminal of a filter capacitor of the LED lighting system to the second terminal of the charge pump capacitor; and
coupling a second terminal of the filter capacitor to a ground plane.

16. The method of claim 15, wherein in detecting the second voltage level on the charge pump capacitor, the capacitor detector circuit detects a voltage only across the first and second terminals of the charge pump capacitor.

17. The method of claim 15, wherein in detecting the second voltage level on the charge pump capacitor, the capacitor detector circuit detects a voltage between the first terminal of the charge pump capacitor and the ground plane.

18. The method of claim 10, wherein a slew rate of the gate driver is configurable, and wherein a capacity of the charge pump capacitor is sized based upon the slew rate.

19. A charge pump system for a light emitting diode (LED) lighting system for an automobile, the charge pump system comprising:
a charge pump capacitor;

a charge pump coupled to a power rail, the charge pump including a charge pump output connected to a first terminal of the charge pump capacitor, the charge pump output to provide power to a gate driver of a LED element switch block at a nominal voltage level on the charge pump output, the nominal voltage level being greater than a first voltage threshold reference voltage, the charge pump further including a charge pump input coupled to the first terminal and to a second terminal of the charge pump capacitor; and a capacitor detector circuit including a detector input and a detector output, the detector input connected to the charge pump output and to the first terminal of the charge pump capacitor to detect a second voltage level on the charge pump capacitor, the capacitor detector circuit to provide a first indication on the detector output that the charge pump capacitor is present and undamaged when the second voltage level is greater than the nominal voltage level and to provide a second indication on the detector output that the charge pump capacitor is not present or is damaged when the second voltage level is less than the nominal voltage level.

20. The charge pump system of claim 19, wherein the capacitor detector circuit is further to provide the first indication on the detector output not only when the second voltage level is greater than the nominal voltage level, but also when the second voltage level is greater than a high voltage threshold reference voltage, and wherein the capacitor detector circuit is further to provide the second indication on the detector output not only when the second voltage level is less than the nominal voltage level, but also when the second voltage level is less than a low voltage threshold reference voltage.

* * * * *